United States Patent
Lifka et al.

(10) Patent No.: US 6,790,690 B2
(45) Date of Patent: Sep. 14, 2004

(54) METHOD OF MANUFACTURING A DISPLAY DEVICE

(75) Inventors: Herbert Lifka, Eindhoven (NL);
Freddy Roozeboom, Eindhoven (NL);
Rene Johan Gerrit Elfrink, Eindhoven (NL); Mark Thomas Johnson, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 196 days.

(21) Appl. No.: 10/052,342

(22) Filed: Jan. 18, 2002

(65) Prior Publication Data

US 2002/0102757 A1 Aug. 1, 2002

(30) Foreign Application Priority Data

Jan. 26, 2001 (EP) .......................................... 01200302

(51) Int. Cl.[7] ............................................. H01L 21/00
(52) U.S. Cl. .......................... 438/26; 438/30; 438/106; 438/113; 438/455; 438/458; 438/460
(58) Field of Search ............................................ 438/30

(56) References Cited

U.S. PATENT DOCUMENTS

| | | | | |
|---|---|---|---|---|
| 4,783,594 A | * | 11/1988 | Schulte et al. | 250/370.08 |
| 5,858,814 A | | 1/1999 | Goossen et al. | 438/107 |
| 6,100,103 A | * | 8/2000 | Shim et al. | 438/26 |
| 6,214,733 B1 | * | 4/2001 | Sickmiller | 438/691 |
| 2003/0087476 A1 | * | 5/2003 | Oohata et al. | 438/108 |

FOREIGN PATENT DOCUMENTS

EP 0631317 A2 12/1994 ........... H01L/25/16

* cited by examiner

*Primary Examiner*—John F. Niebling
*Assistant Examiner*—Angel Roman

(57) ABSTRACT

ICs (20) are nearly separated from the semiconductor substrate (10) on/in which they are formed. Subsequently, the substrate is positioned upside down on a substrate (carrier) (3) which is provided with glue (21) at the location of a crystal. After attachment of the crystal to the carrier, the semiconductor substrate is removed and the crystal remains attached to the carrier e.g. at the crossing of rows and columns. The separate crystals may contain TFTs (simple AM addressing) but also more complicated electronics (address of pixel in memory+identification).

11 Claims, 4 Drawing Sheets

METHOD OF MANUFACTURING A DISPLAY DEVICE

Figure 1:
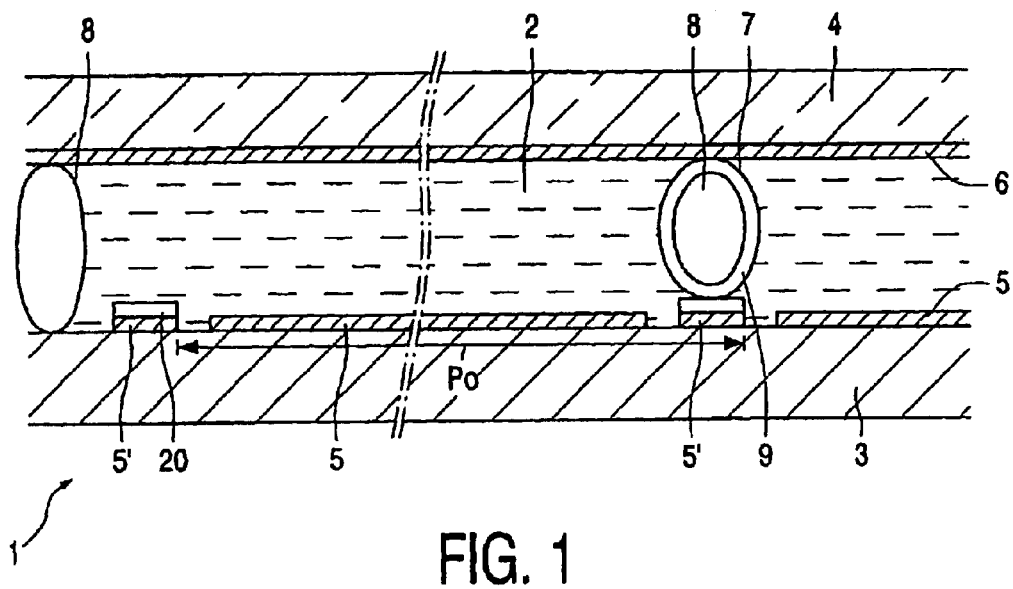

The invention relates to a method of manufacturing a display device, in which a substrate is provided with groups of at least one pixel and a conductor pattern, and in which a semiconductor device for supplying drive voltages to the pixel is fixed to the substrate.

Examples of such active matrix display devices are the TFT-LCDs or AM-LCDs which are used in laptop computers and in organizers, but they also find an increasingly wider application in GSM telephones. Instead of LCDs, for example, (polymer) LED display devices can be used.

More generally, the invention relates to a method of manufacturing an electronic device, in which at least a substrate is provided with functional groups comprising at least a switching element, and in which a semiconductor device for supplying drive voltages to the switching element is fixed to the substrate.

The article "Flexible Displays with Fully Integrated Electronics", SID Int. Display Conf., September 2000, pp. 415 to 418, describes a process in which specifically formed semiconductor devices in a liquid suspension are passed across a substrate and reach correspondingly formed "apertures" or indentations in the substrate. The semiconductor devices are ICs which are manufactured by means of standard techniques. After the ICs have been provided, connections with pixels are established.

A problem occurring in this case is the fact that, for providing the ICs, considerable tolerances are to be taken into account. Not only must the semiconductor devices (ICs) glide, as it were, into the indentations but they also have a certain thickness (approximately 50 micrometers). Dependent on variations of thickness, certainly when not all ICs come from one and the same wafer, and variations on the surface of the substrate in the depth of the "apertures" or indentations, a variation will occur in the thickness of the electro-optical layer provided on the substrate, which thickness may amount to several micrometers. Notably when thickness-sensitive effects such as, for example, the (S)TN effect are used, this leads to unwanted discoloration and non-uniform switching behavior.

Inaccuracies during placement of the ICs must also be taken into account. When an IC "glides into the indentations", it may find its ultimate destination at an arbitrary location within this indentation. Consequently, the indentations occupy a much larger space than the semiconductor devices (ICs), which, notably in transparent display devices, is at the expense of the aperture. To be able to satisfactorily contact the ICs in the case of this inaccurate placement, these ICs must be provided with large contact surfaces, which is at the expense of IC surface area and renders the technology shown very expensive.

A further problem is the variation of the thickness of the semiconductor devices (ICs), related to the depth variation of the indentations so that local thickness variations occur in the ultimate surface area (the common surface area of the substrate). Conductor tracks extending in the device shown across the embedded semiconductor devices (ICs), thereby run a great risk of breakage.

To this end, a semiconductor substrate according to the invention is provided with a plurality of semiconductor devices whose surfaces have electric connection contacts, the semiconductor devices being mutually separated in a surface region of the semiconductor substrate and the electric connection contacts being coupled to the conductor pattern (in an electrically conducting manner) whereafter the semiconductor devices are separated from the semiconductor substrate.

Since the semiconductor devices (ICs) are similarly situated with respect to each other as on the semiconductor substrate during their fixation to the substrate, the ICs are provided at a very accurate pitch. This may be a constant pitch in one direction, such as in matrix-shaped configurations of the pixels. The pitch may alternatively be variable.

Moreover, due to this method of fixation, only parts of the surface area of the semiconductor substrate in which the active elements are realized can be provided on the substrate of the display device. Since these parts have a negligible thickness (less than 1 micrometer), said thickness-sensitive effects do not occur. Even the presence of a spacer at the location of an IC does not have any influence or hardly has any influence on the effective thickness of the liquid layer and hence on the operation of the display device, certainly when spacers with an elastic envelope are chosen.

A further advantage is that the ICs can now comprise drive electronics at the location of the pixels. This provides great freedom of design.

The semiconductor devices are separated, for example, by means of an etching treatment in a surface area of the semiconductor substrate. In an alternative method, the semiconductor devices are provided in a semiconductor layer on an insulating layer (SOI technology) and separated by means of an etching treatment in this semiconductor layer having a thickness of typically 0.2 micrometer. The result is that these semiconductor devices in the finished display device have a negligible thickness (less than 1 micrometer) as compared with the effective thickness of the liquid layer, so that said thickness-sensitive effects do not occur, not even in the presence of a spacer at the location of an IC. Moreover, the ICs are now placed with great accuracy and without taking extra precautions. The contact surfaces may now be considerably smaller, which occupies less IC surface.

These and other aspects of the invention are apparent from and will be elucidated with reference to the embodiments described hereinafter.

Figure 2:
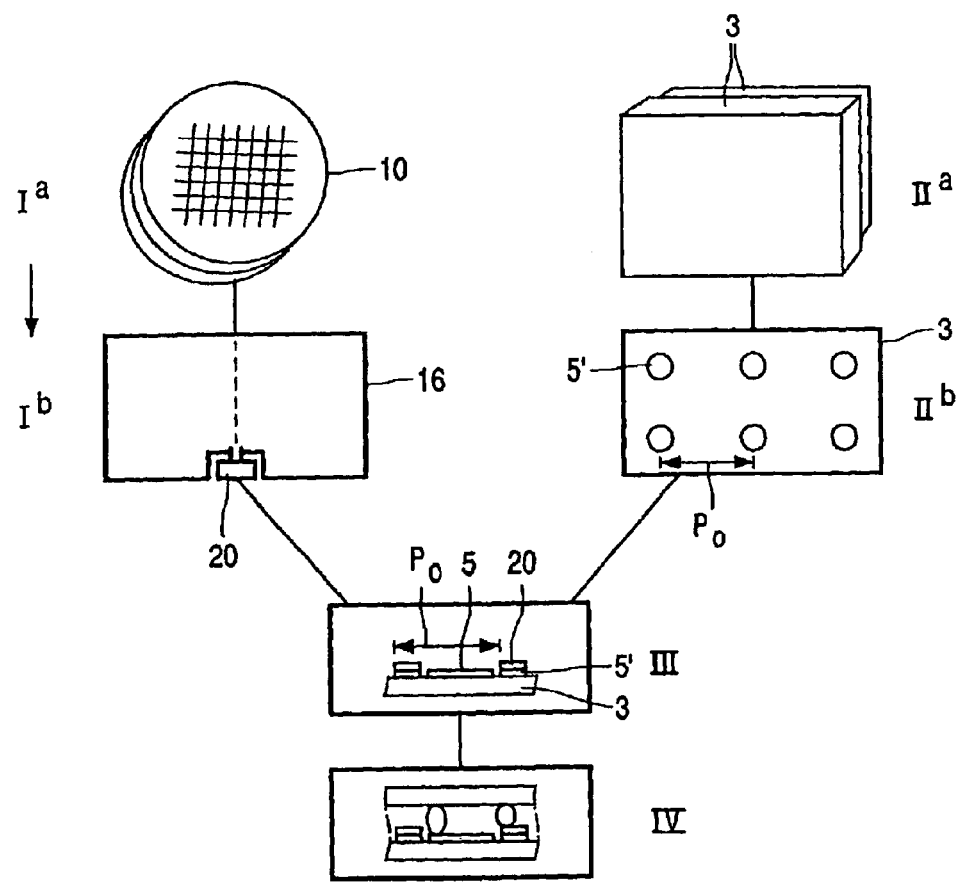
Figure 3A:
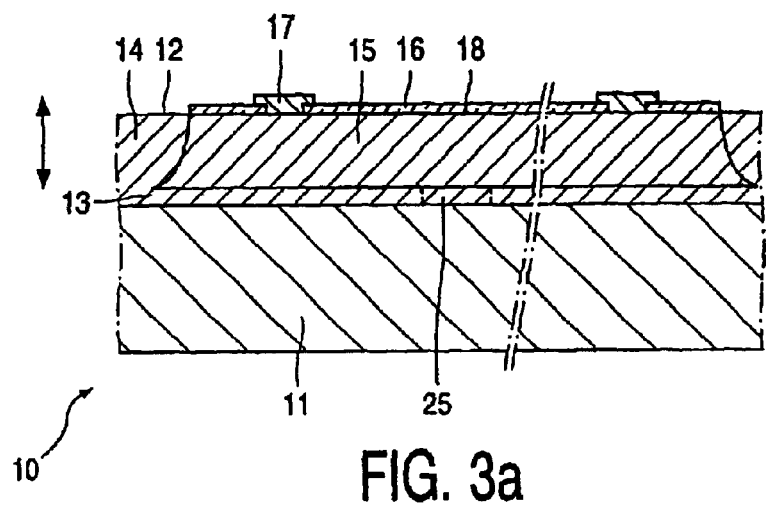
Figure 3B:
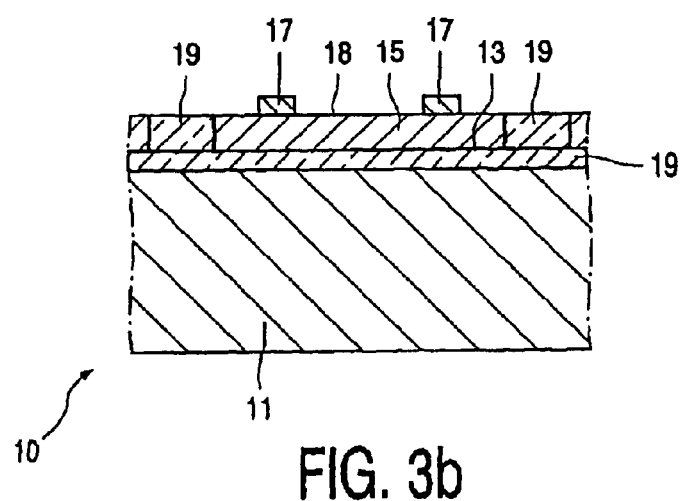
Figure 4:
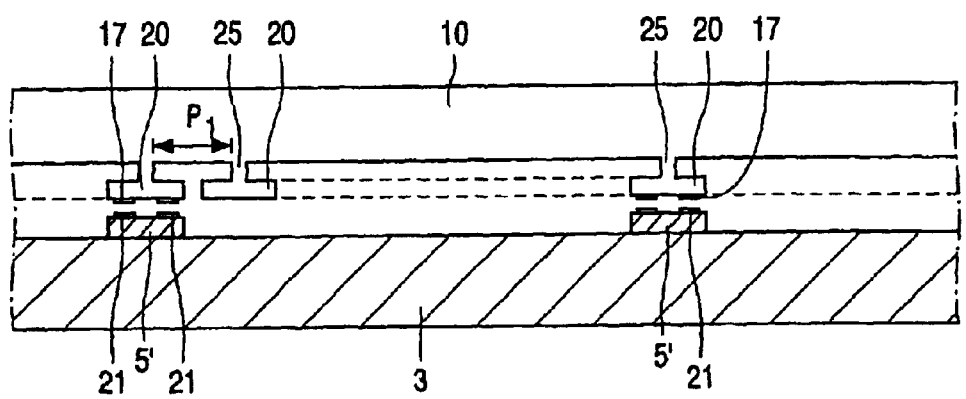
Figure 5:
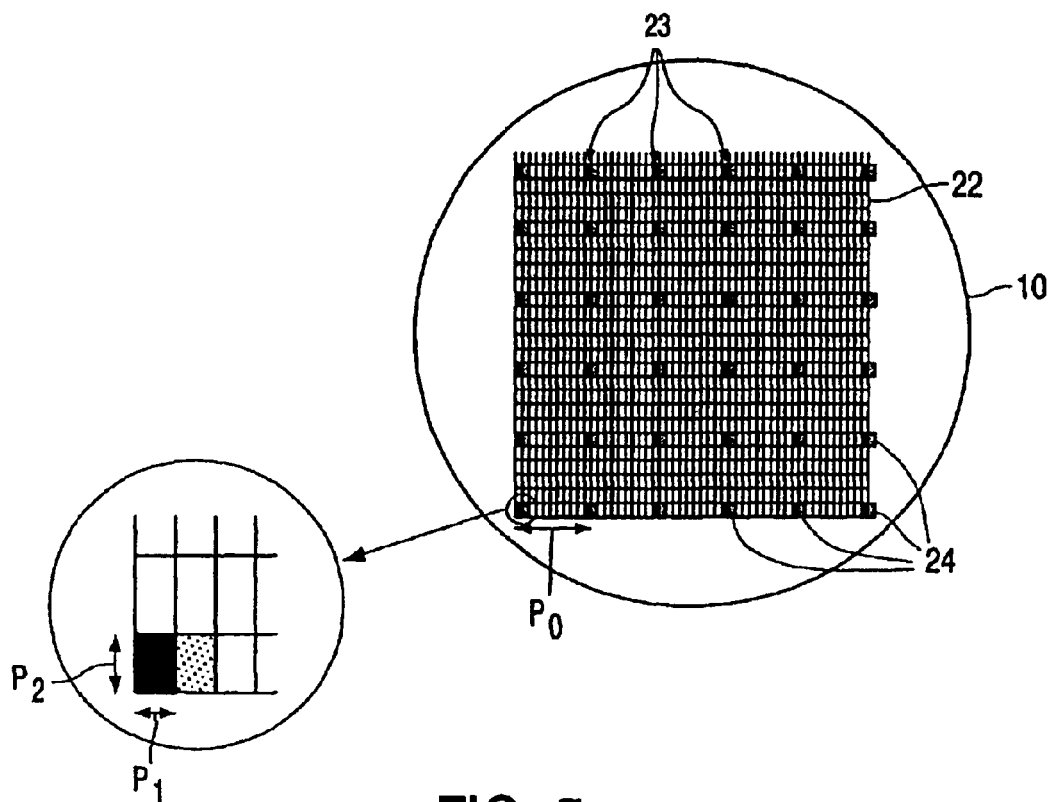
Figure 6:
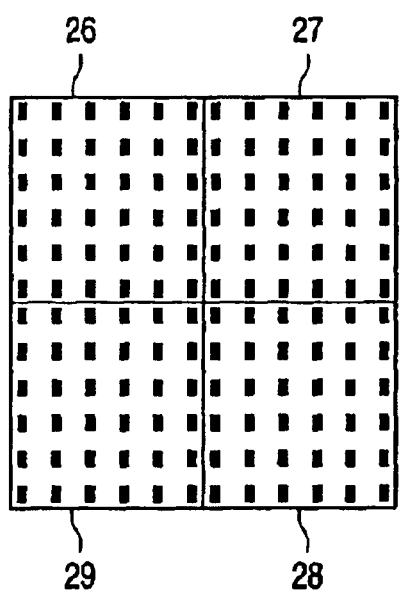
Figure 7:
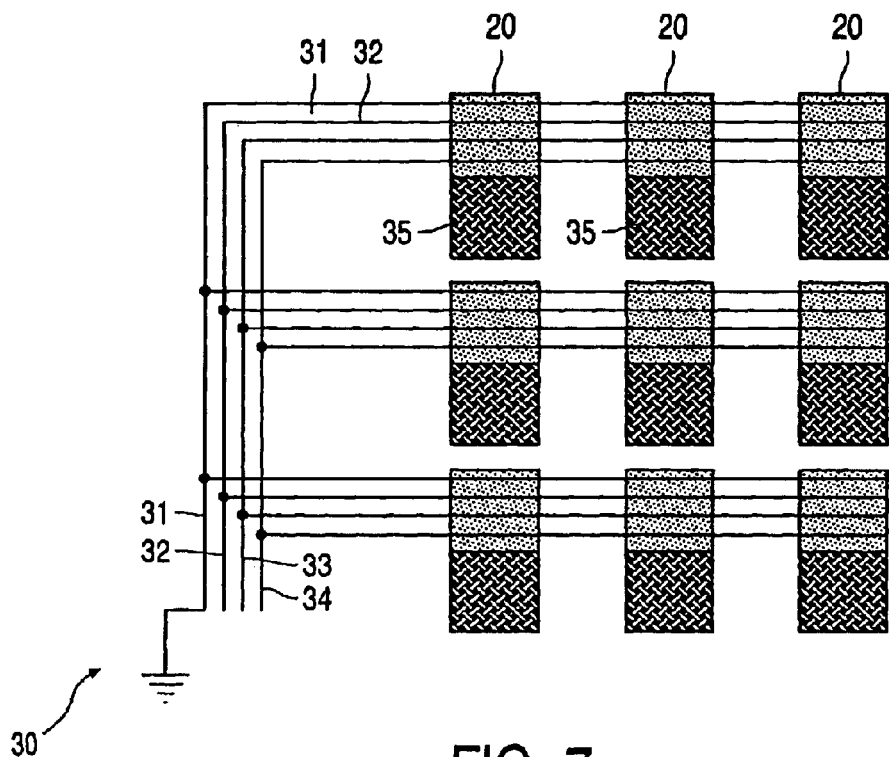
Figure 8:
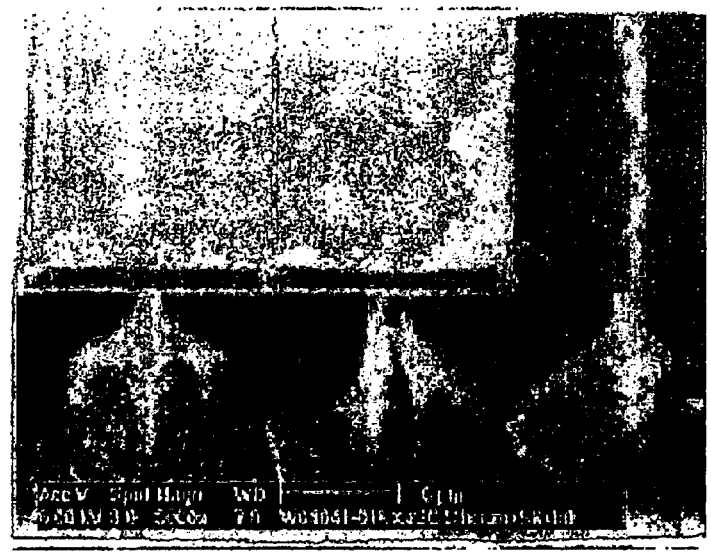

In the drawings:

FIG. 1 is a diagrammatic cross-section of a part of a display device according to the invention, FIG. 2 shows diagrammatically a flow chart of the method, FIGS. 3 and 4 show diagrammatically steps during the manufacture of the display device of FIG. 1, FIGS. 5 and 6 show diagrammatically the semiconductor substrate and the substrate of the display device during manufacture of the display device of FIG. 1, while FIG. 7 is an electrical equivalent of a possible embodiment of a display device according to the invention, and FIG. 8 shows an electron-microscopic image of the semiconductor substrate for fixation of the display device to the substrate.

The Figures are diagrammatic and not drawn to scale. Corresponding elements are generally denoted by the same reference numerals.

FIG. 1 is a diagrammatic cross-section of a part of a light-modulating cell 1 with a liquid crystal material 2 which is present between two substrates 3, 4 of, for example, glass or synthetic material, provided with (ITO or metal) electrodes 5, 6. Together with an intermediate electro-optical layer, parts of the electrode patterns define pixels. If necessary, the display device comprises orientation layers (not shown) which orient the liquid crystal material on the inner walls of the substrates. The liquid crystal material may be a (twisted) nematic material having, for example, a positive optical anisotropy and a positive dielectric anisotropy, but may also make use of the STN effect, a bistable effect, a chiral nematic effect, or the PDLC effect. The substrates 3, 4 are customarily spaced apart by spacers 7, while the cell is sealed with a sealing rim 8 which is customarily provided with a filling aperture. A typical thickness of the layer of liquid crystal material 2 is, for example, 5 micrometers. The electrodes 5, 5' have a typical thickness of 0.2 micrometer, while also the thickness of the semiconductor devices (ICs) 20 is about 0.2 micrometer in this example. In FIG. 1, a spacer 7 is shown at the location of an electrode 5' and IC 20. The overall thickness of electrode and IC 20 is substantially negligible as compared with the thickness of the layer of liquid crystal material 2. The presence of the spacer 7 does not have any influence, or hardly has any influence, on the opto-electrical properties of the display device, notably when spacers with a hard core 8 and an elastic envelope 9 having a thickness of about 0.2 micrometer are chosen.

For manufacturing the semiconductor devices (transistors or ICs) 20, use is made of conventional techniques. The starting material is a semiconductor wafer 10 (see FIG. 2, step I$^a$, FIG. 3), preferably silicon, with a p-type substrate 11 on which an n-type epitaxial layer 15 having a weak doping ($10^{14}$ atoms/cm$^3$) is grown. Prior to this step, a more heavily doped n-type layer 13 (doping about $10^{17}$ atoms/cm$^3$) is provided by means of epitaxial growth or diffusion. Further process steps (implantation, diffusion, etc.) realize transistors, electronic circuits or other functional units in the epitaxial layer 15. After completion, the surface in the example of FIG. 3A is coated with an insulating layer such as silicon oxide. Contact metallizations 17 are provided via contact apertures in the insulating layer by means of techniques which are customary in the semiconductor technology. An n-type region 14 (doping about $10^{17}$ atoms/cm$^3$) is provided between the transistors, electronic circuits (ICs) or other functional units, likewise by masked doping (before or after providing the insulating layer 16).

FIG. 3B shows a variant of FIG. 3A, in which the transistors, electronic circuits or other functional units are realized in the SOI technology in which the thin surface area 15 is embedded in insulating layer 19. In the example of FIG. 3B, the contact metallizations 17 are directly provided on contact regions of the transistors of the semiconductor devices.

Subsequently, the n-type regions 14 are subjected via a mask to an etching treatment with HF (under the influence of an electric field). In this treatment, the heavily doped n-type region 14 is isotropically etched, as well as the underlying n-type epitaxial layer 13. The weakly doped n-type epitaxial layer 15 is, however, etched anisotropically so that, after a given period, only a small region 25 remains in this layer (see FIG. 2, step I$^b$ FIG. 3).

The transistors, electronic circuits (ICs) or other functional units are, however, still at their originally defined position. A regular pattern of such units will generally be manufactured at a fixed pitch.

Prior to, simultaneously with or after this treatment, substrates 3 of the display device are provided with metallization patterns which (also at defined positions) will comprise one or more electrodes 5' (FIG. 2, steps II$^a$, II$^b$). In this example, the parts 5' of the metallization patterns on the substrate 3 are ordered similarly (the same pitch in different directions) as the electronic circuits (ICs) 20 in the semiconductor wafer 10.

In a subsequent step, the semiconductor wafer 10 is turned upside down, in which the metallization patterns 5' on the substrate 3 are accurately aligned with respect to the electronic circuits (ICs) 20 in the semiconductor wafer 10 (FIG. 4), whereafter electrical contact is realized between metallization patterns 5' and the contact metallizations 17. To this end, use is made of, for example, a conducting glue 21 or anisotropically conducting contacts on the electrodes 5'. The electronic circuits (ICs) 20 are detached from the semiconductor wafer 10 by means of vibration or by a different method. The substrate 3 is then obtained which is provided with picture electrodes 5 and ICs 20 which are very accurately aligned both with respect to the picture electrodes 5 and with respect to each other (step III in FIG. 2). Moreover, the reduction of aperture is exclusively determined by the dimension of the ICs (or transistors).

Also when using SOI technology, a first separation between the various electronic circuits (ICs) 20 can be made by means of a HF etching treatment or other methods which are conventional in the semiconductor technology, which ICs are subsequently detached from the substrate also by means of vibration or by means of another method.

Not all ICs (transistors) of the substrate 10 are detached from the substrate during this step, because the pitch $p_0$ of the metallization patterns 5' is usually much larger than the pitch $p_1$ and pitch $p_2$ of the ICs 20. This will be further explained with reference to FIG. 5. If the substrate 3 has a size of the order of (or smaller than) the region indicated by the block 22 of detachable ICs, only the ICs 23 (black ICs in FIG. 5) are detached and provided on the substrate.

If the substrate 3 is larger than the diagrammatically shown block 22 of detachable ICs, the ICs 23 (black ICs in FIG. 5) are first detached and provided on the part 26 on the substrate 10 (see FIG. 6). Subsequently the adjacent ICs 24 (see FIG. 5) are detached and provided on the part 27 of the substrate 10. Similarly, ICs 20 are provided on the parts 28, 29.

The display device 1 is subsequently completed in a customary manner, if necessary, by providing orientation layers which orient the liquid crystal material on the inner walls of the substrate. Spacers 7 are customarily provided between the substrates 3, 5, as well as a sealing rim 8 which is customarily provided with a filling aperture, whereafter the device is filled with LC material in this example (step IV in FIG. 2).

Since the semiconductor devices (ICs) 20 are made in advance, more extensive electronic functions can be realized therein than in the conventional polysilicon technology. Notably when using monocrystalline silicon, it is possible to realize functions with which a different type of architecture of the display device can be made possible than with the conventional matrix structure. Such a device 30 is shown in FIG. 7, which is a device having a bus structure. The ICs (semiconductor devices) 20 are connected to a supply voltage via connection lines 31, 32 (in this example, line 31 is connected to earth), while the lines 33, 34 supply information and, for example, a clock signal. Since, as described above, the location of an IC to be provided is known in advance, this may be provided first (during IC processing or via e-PROM techniques), for example, with an address register and one or more data registers. For certain ICs (and associated (groups) of pixels 35), the address is recognized by the ICs and picture information is stored, whereafter it is applied to the pixels 35, dependent on commands to be also supplied through the lines 33, 34.

FIG. 8 is an electron-microscopical image of the semiconductor substrate for fixation to the substrate (FIG. 2, step I$^b$).

The protective scope of the invention is not limited to the embodiment described. As stated in the opening paragraph, the pixels may also be formed by (polymer) LEDs which may be provided separately or as one assembly, while the invention is also applicable to other display devices, for example, plasma displays, foil displays and display devices based on field emission, electro-optical or electromechanical effects (switchable mirrors). Where the examples state a pitch in an orthogonal system of co-ordinates, the localization may also take place in a radial system of co-ordinates or in a tree structure (fractal structure). As already stated, the pitch may also be variable. This provides the possibility of manufacturing, for example, circular or elliptic display devices.

The examples stated the direct electric contact of the ICs on metallization patterns 5' that were already present. Since the detached ICs have a small thickness, they may also be provided directly on the substrate 3, in which method apertures which are metallized are etched through the layers 15 by means of an etching method. The contact metallizations then extend across the ICs and make contact (for example, via contact apertures in an insulating layer) with through-metallized connections to the contact metallizations 17.

Said contacts do not need to be electrically conducting contacts. In given applications, it may be useful to provide a capacitive coupling between the contact metallizations 17 and the metallization patterns 5', for example, by providing one or both with a thin insulating layer.

As also stated in the opening paragraph, the method is not limited to display devices. The invention is notably applicable to electronic devices (sensors) in which the substrate is provided with functional groups.

Alternatively, as stated, flexible substrates (synthetic material) may be used (wearable displays, wearable electronics).

The invention resides in each and every novel characteristic feature and each and every combination of characteristic features. Reference numerals in the claims do not limit their protective scope. Use of the verb "to comprise" and its conjugations does not exclude the presence of elements other than those stated in the claims. Use of the article "a" or "an" preceding an element does not exclude the presence of a plurality of such elements.

What is claimed is:

1. A method of manufacturing a display device, in which a substrate is provided with groups of at least one pixel and a conductor pattern and in which a semiconductor device for supplying drive voltages to the pixel is fixed to the substrate, the method comprising the steps of providing a semiconductor substrate with a plurality of semiconductor devices having electric connection contacts on their surfaces, mutually separating the semiconductor devices in a surface region of the semiconductor substrate, coupling the electric connection contacts to the conductor pattern, and subsequently separating the semiconductor devices from the semiconductor substrate.

2. A method as claimed in claim 1, wherein at least a part of the electric connection contacts is connected to the conductor pattern in an electrically conducting manner.

3. A method as claimed in claim 1, wherein the semiconductor devices have the same pitch as the groups of pixels in at least one dimension.

4. A method as claimed in claim 1, wherein a semiconductor device is associated with a plurality of pixels.

5. A method as claimed in claim 4, wherein the semiconductor device comprises device electronics for the pixels.

6. A method as claimed in claim 1, wherein the semiconductor devices are separated by means of an etching treatment in a surface region of the semiconductor substrate.

7. A method as claimed in claim 1, wherein the semiconductor devices are provided in a semiconductor layer on an insulating layer and are separated by means of an etching treatment.

8. A method as claimed in claim 1, wherein the substrate is flexible.

9. A method of manufacturing an electronic device, in which at least a substrate is provided with functional groups comprising at least a switching element, and in which a semiconductor device for supplying drive voltages to the switching element is fixed to the substrate, the method comprising the steps of providing the substrate with a conductor pattern, providing a semiconductor substrate with a plurality of semiconductor devices having electric connection contacts on their surfaces, mutually separating the semiconductor devices in a surface region of the semiconductor substrate, coupling the electric connection contacts to the conductor pattern, and subsequently separating the semiconductor devices from the semiconductor substrate.

10. A method as claimed in claim 9, wherein at least a part of the electric connection contacts is connected to the conductor pattern in an electrically conducting manner.

11. A method as claimed in claim 9, wherein the semiconductor devices have the same pitch as the functional groups in at least one dimension.

* * * * *